(12) United States Patent
Kanbe

(10) Patent No.: US 7,256,469 B2
(45) Date of Patent: Aug. 14, 2007

(54) SOLID-STATE IMAGE PICKUP DEVICE

(75) Inventor: Hideo Kanbe, Kanagawa (JP)

(73) Assignee: Sony Corporation, Tokyo (JP)

( * ) Notice: Subject to any disclaimer, the term of this patent is extended or adjusted under 35 U.S.C. 154(b) by 34 days.

(21) Appl. No.: 11/015,140

(22) Filed: Dec. 17, 2004

(65) Prior Publication Data

US 2005/0139943 A1    Jun. 30, 2005

(30) Foreign Application Priority Data

Dec. 25, 2003   (JP)   ............................. 2003-430505

(51) Int. Cl.
*H01L 31/06*   (2006.01)

(52) U.S. Cl. ...................... 257/461; 257/462; 257/465; 257/E31.089

(58) Field of Classification Search ................. 257/461
See application file for complete search history.

(56) References Cited

U.S. PATENT DOCUMENTS 6,583,484 B2 *   6/2003   Pan et al. .................... 257/461
6,885,047 B2 *   4/2005   Shinohara et al. .......... 257/292

* cited by examiner

*Primary Examiner*—Tu-Tu Ho
(74) *Attorney, Agent, or Firm*—Robert J. Depke; Rockey, Depke, Lyons LLC.

(57) ABSTRACT

A solid-state image pickup device 10 has an arrangement in which a second conductivity type semiconductor region 14 is formed on the surface of a first conductivity type electric charge accumulation region 13 of a light-receiving sensor portion, a shallow trench isolation layer 20 formed of an insulating layer is buried into a trench formed on a semiconductor substrate 11, the shallow trench isolation layer 20 is composed of an upper wide portion 21 and a lower narrow portion 22 and a second conductivity type semiconductor region 23 is formed around the lower narrow portion 22 of the shallow trench isolation layer 20. The solid-state image pickup device can suppress the occurrence of a dark current and a white spot, it can produce an image with high image quality and it can sufficiently maintain a sufficiently large amount of electric charges that can be handled by the light-receiving sensor portion.

6 Claims, 6 Drawing Sheets

SOLID-STATE IMAGE PICKUP DEVICE

BACKGROUND OF THE INVENTION

1. Field of the Invention

The present invention relates to a solid-state image pickup device.

2. Description of the Related Art

As a pixel cell of a solid-state image pickup device becomes micro-miniaturized more, particularly in a CMOS (complementary metal-oxide semiconductor) sensor (CMOS type solid-state image pickup device), it is frequently observed that a pixel portion also uses a trench element isolation structure (so-called STI: shallow trench isolation) structure similarly to a peripheral circuit portion.

Also, it becomes customary that a light-receiving portion uses a buried photodiode structure to decrease a dark current.

Then, when the pixel portion uses the shallow trench isolation structure as described above, since a depletion layer extending from a light-receiving sensor portion reaches the side wall of the shallow trench isolation layer, there arises a problem, in which a dark current is generated at the $SiO_2/Si$ interface of the side surface of this shallow trench isolation layer. For this reason, it has been requested to suppress the occurrence of the dark current on the side surface of the shallow trench isolation layer.

Also, even when the pixel portion does not use the shallow trench isolation structure, in order to increase sensitivity of a solid-state image pickup device, it has been requested to decrease the occurrence of the dark current in the pixel portion as much as possible.

Accordingly, in the shallow trench isolation structure realized by a LOCOS (local oxidation of silicon) method, it has been considered so far to decrease a dark current in a pixel portion.

For example, there is proposed a method in which a $P^+$ region is formed under or near a LOCOS trench isolation layer and an N-layer in a photoelectric conversion portion is formed deeper than the LOCOS trench isolation layer to thereby decrease a dark current (see cited patent reference 1).

Further, there is also proposed a method in which a peripheral circuit portion is formed of a LOCOS trench isolation layer, the LOCOS trench isolation layer is not formed around the transistor of the pixel portion and the light-receiving portion but a polycrystalline silicon oxide film is formed on the $P^+$ region of the trench isolation region to thereby decrease stress and to decrease a dark current (see cited patent reference 2).

[Cited patent reference 1]: Official gazette of Japanese laid-open patent application No. 10-308507

[Cited patent reference 2:] Official gazette of Japanese laid-open patent application No. 11-312731

Accordingly, when the pixel portion uses the shallow trench isolation layer structure, in order to suppress the occurrence of the dark current on the side surface of the shallow trench isolation layer, it is sufficient that the $P^+$ region may be formed around the shallow trench isolation layer.

FIG. 1 of the accompanying drawings is a schematic cross-sectional view showing a CMOS (complementary metal-oxide semiconductor) type solid-state image pickup device using a shallow trench isolation layer structure and a buried photodiode structure according to the related art.

A solid-state image pickup device, generally depicted by reference numeral 50 in FIG. 1, includes a substrate 51 on which a P-type semiconductor well region 52 is formed. An N-type semiconductor region 53 which serves as an electric charge accumulation region of a light-receiving sensor portion and an $N^-$ floating diffusion region 56 are formed on this P-type semiconductor well region 52.

Also, a P-type ($P^+$) positive electric charge accumulation region 54 is formed near the surface of the substrate 51 on the N-type semiconductor region 53.

These P-type semiconductor well region 52, N-type semiconductor region 53 and P-type positive electric charge accumulation region 54 constitute a so-called buried photodiode structure.

Also, there is formed a shallow trench isolation layer 60 formed of an insulating layer (for example, a silicon oxide layer, a silicon nitride layer or a multilayer formed of the silicon oxide layer and the silicon nitride layer) for electrically isolating the transistor and the photodiode of the light-receiving sensor portion. The photodiode of the light-receiving sensor portion and the region such as the source/drain region of the transistor are formed near the substrate 51 in this shallow trench isolation layer 60.

The positive electric charge accumulation region 54 is formed adjacent to this shallow trench isolation layer 60 and it is formed wider than the N-type semiconductor region 53.

A gate insulating film 57 is formed on the surface of the substrate 51 and a read gate electrode 58 and a reset gate electrode 59 are formed on this gate insulating film 57.

The read gate electrode 58, the gate insulating film 57, the N-type semiconductor region 53 of the light-receiving sensor portion and the floating diffusion region 56 constitute a read transistor. A channel portion of this read transistor, that is, a space between the floating diffusion region 56 and the N-type semiconductor region 53 is formed as a read region 55.

Further, according to the need, assemblies such as a color filter or a on-chip lens are formed above to thereby construct the solid-state image pickup device 50.

Then, in this solid-state image pickup device 50, a P-type ($P^+$) semiconductor region 61 is formed around (side wall and under) the shallow trench isolation layer 60. This P-type semiconductor region 61 can decrease a dark current generated around the shallow trench isolation layer 60.

However, in order to sufficiently suppress the occurrence of the dark current around the shallow trench isolation layer 60, the P-type semiconductor region 60 should be formed thick or a concentration of P-type impurities of the P-type semiconductor region 61 should be increased.

When the P-type semiconductor region 61 is formed thick, the area of the N-type semiconductor region 53 of the light-receiving sensor portion is decreased so that an amount of signal electric charges to be accumulated (amount of electric charges to be handled) also is decreased. Hence, it becomes difficult to main a desired dynamic range.

Further, when the concentration of the P-type impurities of the P-type semiconductor region 61 is increased, since the P-type impurities of the P-type semiconductor region 61 become easy to be diffused, the P-type impurities are easily diffused into the side of the light-receiving sensor portion. As a result, the amount of the signal electric charge that can be accumulated in the N-type semiconductor region 53 of the light-receiving sensor portion (amount of electric charges to be handled) is decreased unavoidably.

Further, this solid-state image pickup device 50 has the structure in which a contact hole of an interconnection is formed above the shallow trench isolation layer 60 as shown in FIG. 1.

That is, a contact portion gate electrode 62 is formed above the shallow trench isolation layer 60 through the gate insulating film 57, and this gate electrode 62 is connected to metal interconnections 64 of first and second layers through via interconnections 63 which connect the upper and lower metal interconnections 64.

Since this solid-state image pickup device 50 has the structure in which the contact hole of the interconnection 64 is formed above the shallow trench isolation layer 60 as described above, the solid-state image pickup device 50 is restricted from a pattern rule standpoint of the interconnection 64 and the contact hole. Further, considering a margin in the manufacturing process, it is necessary to maintain a width larger than a certain width of the shallow trench isolation layer 60.

Accordingly, it is frequently observed that the width of the shallow trench isolation layer 60 cannot be determined, and hence it becomes difficult to microminiaturize the device.

However, if the width of the shallow trench isolation layer 60 is increased, then also in this case, the area of the N-type semiconductor region 53 of the light-receiving sensor portion is decreased and the amount of signal electric charges that can be accumulated (amount of electric charges to be handled) also is decreased.

While the number of the pixels of the solid-state image pickup is increased and the solid-state image pickup device is microminiaturized increasingly or the power consumption of the solid-state image pickup device is decreased more increasingly in recent years, the pixel cell and the surrounding transistor should be microminiaturized and hence it becomes customary to use a shallow trench isolation layer as a device isolation structure of a transistor and the like.

On the other hand, in order to maintain an S/N (signal-to-noise ratio) and a sensitivity characteristic high enough as those of the camera, the solid-state image pickup device is requested to decrease a dark current more.

Accordingly, a buried photodiode structure which can suppress a dark current has so far been used as a structure of a light-receiving sensor portion.

However, as described above, when the buried photodiode and the shallow trench isolation layer are combined, there arises a problem in which the occurrence of the dark current in the side wall of the shallow trench isolation layer should be suppressed. When the P-type semiconductor region is formed on the side wall of the shallow trench isolation layer as a countermeasure for suppressing the occurrence of the dark current, there arises a secondary effect in which an amount of electric charges to be handled by the electric charge accumulation region is decreased unavoidably.

SUMMARY OF THE INVENTION

In view of the aforesaid aspect, it is an object of the present invention to provide a solid-state image pickup device capable of suppressing the occurrence of a dark current or a white spot.

It is other object of the present invention to provide a solid-state image pickup device capable of generating an image with high image quality.

It is a further object of the present invention to provide a solid-state image pickup device which can maintain a sufficiently large amount of electric charges that can be handled by a light-receiving sensor portion.

It is yet a further object of the present invention to provide a solid-state image pickup apparatus which may be either a solid-state image pickup apparatus formed as one chip or a module type solid-state image pickup apparatus formed as a set of a plurality of chips which can generate a high-quality image output signal with a wide dynamic range and in which performance of an electronic device with a module mounted thereon can be improved.

According to an aspect of the present invention, there is provided a solid-state image pickup device which is comprised of a sensor portion including a first conductivity type electric charge accumulation region and a second conductivity type semiconductor region formed above the first conductivity type electric charge accumulation region and a isolation portion provided within a trench formed on a semiconductor substrate, wherein the isolation portion is composed of an upper wide region and a lower narrow portion, a second conductivity type semiconductor region being formed around the lower narrow portion of the isolation portion.

In the solid-state image pickup device, the upper wide portion includes a first diffusion region, the lower narrow portion includes a second diffusion region different from the first diffusion region and the first and second diffusion regions are overlapping with each other at their respective end portions.

According to another aspect of the present invention, there is provided a module type solid-state image pickup device which is comprised of an image pickup region comprising a plurality of pixels, each of which includes a sensor portion composed of a first conductivity type electric charge accumulation region and a second conductivity type semiconductor region formed above the first conductivity type electric charge accumulation region and an optical system for introducing incident light into the image pickup region, wherein the pixel includes a isolation portion adjacent to the sensor portion, the isolation portion composed of an upper wide portion and a lower narrow portion and a second conductivity type semiconductor region is formed around the lower narrow portion.

In the module type solid-state image pickup device, the upper wide portion includes a first diffusion region, the lower narrow portion includes a second diffusion region different from the first diffusion region and the first and second diffusion regions are overlapping with each other at their respective end portions.

As a result, since the shallow trench isolation layer includes the lower narrow portion and it is located behind the light-receiving sensor portion as compared with the related-art single shallow trench isolation layer structure, the area of the first conductivity type electric charge accumulation region of the light-receiving sensor portion can increase to increase an amount of electric charges that can be handled by the light-receiving sensor portion.

Also, a dark current generated from the side wall of the lower portion of the shallow trench isolation layer can be decreased by the second conductivity type semiconductor region formed around the lower narrow portion of the shallow trench isolation layer. In particular, the depletion layer extending from the first conductivity type electric charge accumulation region of the light-receiving sensor portion to the lateral direction is blocked by the second conductivity type semiconductor region, whereby the depletion layer can be prevented from reaching the side wall of the shallow trench isolation layer. As a consequence, it is possible to suppress the occurrence of a dark current and a white spot.

As described above, according to the present invention, since the area of the electric charge accumulation region of the photodiode of the light-receiving sensor portion can be increased as compared with the related-art single trench isolation layer structure, an amount of signal electric charges that can be accumulated (electric charges to be handled) can be increased. As a result, it is possible to obtain a solid-state image pickup device with a large dynamic range.

Also, according to the present invention, since the occurrence of the dark current and the white spot can be suppressed by the second conductivity type semiconductor region formed around the lower narrow portion of the shallow trench isolation layer without oppressing the characteristic of the amount of the electric charges to be handled, it is possible to realize a solid-state image pickup device having a high S/N (signal-to-noise ratio) and which can generate an image output with high image quality.

Therefore, according to the present invention, it becomes possible to realize a solid-state image pickup device in which the occurrence of a dark current and a white spot can be suppressed, an image output with high image quality can be obtained and in which a sufficiently large amount of electric charges that are handled by a light-receiving sensor portion can be maintained.

Furthermore, according to the present invention, when a solid-state image pickup apparatus is a module type solid-state image pickup apparatus, it is possible to obtain a high-quality output image signal with a wide dynamic range and performance of an electronic device with a module mounted thereon can be improved.

DESCRIPTION OF THE PREFERRED EMBODIMENTS

The present invention will now be described with reference to the drawings.

Figure 2:
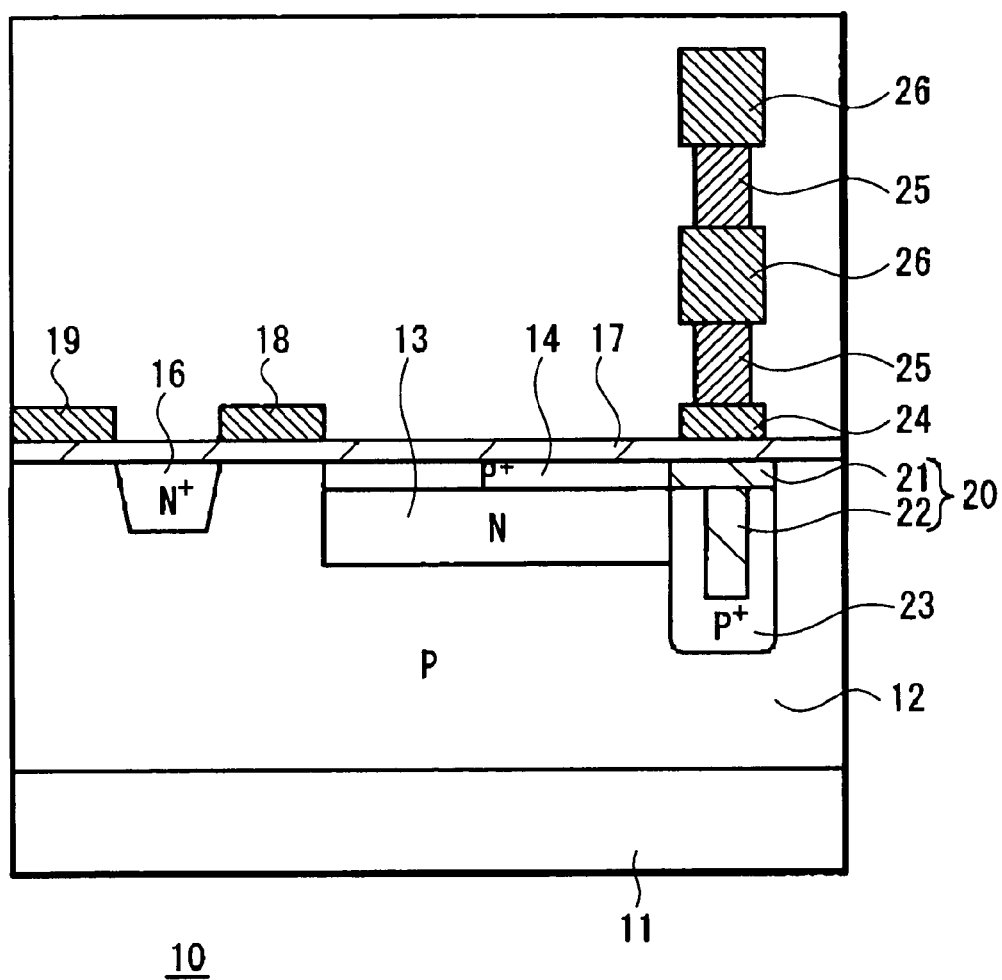
FIG. 2 is a schematic cross-sectional view showing an arrangement of a solid-state image pickup device according to an embodiment of the present invention.

FIG. 2 is a schematic cross-sectional view showing an arrangement of a solid-state image pickup device according to an embodiment of the present invention. FIG. 2 shows a cross-section of one pixel cell. In this embodiment, the present invention is applied to a CMOS sensor (CMOS type solid-state image pickup device).

As shown in FIG. 2, a P-type semiconductor well region 12 is formed on a substrate 11, and an N-type semiconductor region 13 serving as an electric charge accumulation region of a light-receiving sensor portion and an $N^+$ floating diffusion region 16 are formed on this P-type semiconductor well region 12.

Also, a P-type ($P^+$) positive electric charge accumulation region 14 is formed near the surface of the substrate 11 on the N-type semiconductor well region 13.

These P-type semiconductor well region 12, N-type semiconductor well region 13 and P-type positive electric charge accumulation region 14 constitute a so-called buried photodiode structure.

Further, there is formed a shallow trench isolation layer 20 made of an insulating layer (for example, a silicon oxide layer, a silicon nitride layer or a multilayer formed of the silicon oxide layer and the silicon nitride layer) for electrically isolating the transistor and the photodiode of the light-receiving sensor portion. The photodiode of the light-receiving sensor portion and the regions such as the source/drain of the transistor are formed near the surface of the substrate 11 in this shallow trench isolation layer 20.

The shallow trench isolation layer 20 is formed by filing the trench formed on the substrate 11 with an insulating layer.

A gate insulating layer 17 is formed on the surface of the substrate 11, and a read gate electrode 18 and a reset gate electrode 19 are formed on this gate insulating film 17.

The read gate electrode 18, the gate insulating film 17, the N-type semiconductor region 13 of the light-receiving sensor portion and the floating diffusion region 16 constitute a read transistor. A channel portion of this read transistor, that is, a space between the floating diffusion region 16 and the N-type semiconductor region 13 is formed as the read region.

There is used a structure by which an interconnection contact hole is formed above the shallow trench isolation layer 20.

More specifically, a contact portion gate electrode 24 is formed above the shallow trench isolation layer 20 through the gate insulating film 17, and this gate electrode 24 is connected to metal interconnections 26 of first and second layers through via interconnections 25 for connecting the upper and lower metal interconnections 26.

Further, according to the need, assemblies such as a color filter and an on-chip lens are provided above to thereby construct a solid-state image pickup device 10.

In this embodiment, in particular, the shallow trench isolation layer 20 formed of the insulating layer is composed of an upper (near the surface) wide portion 21 and a lower narrow portion 22. The shallow trench isolation 20 includes these wide and narrow portions 21 and 22 and hence it is formed as the shallow trench isolation layer 20 whose cross-section is shaped like T.

Further, a P-type ($P^+$) semiconductor region 23 is formed around (on the side wall and below) the shallow trench isolation layer 20.

Then, the positive electric charge accumulation region 14 of the light-receiving sensor portion is formed adjacent to the upper wide portion 21 of the shallow trench isolation layer 20 and the N-type semiconductor region 13 that serves as the electric charge accumulation region is formed at the position deeper than the upper wide portion 21 of the shallow trench isolation region 20.

Since the shallow trench isolation layer 20 is constructed as described above, the surface wide portion 21 can satisfy the pattern rules of the contact gate electrode 24, the metal interconnection 26 and the contact hole and a margin for mis-alignment in the manufacturing process can be maintained.

More specifically, since the contact portion gate electrode 24 is formed of a polycrystalline silicon electrode layer or a tungsten-based electrode layer or a molybdenum-based electrode layer and this gate electrode 24 and the metal interconnection 26 are brought in contact with each other on the shallow trench isolation layer 20, from the restrictions of the layout including the metal interconnection of the upper layer, the width of the upper wide portion 21 of the shallow trench isolation layer 20 is determined. For example, when a 0.18 μm-generation MOS (metal-oxide semiconductor) transistor is in use, the width of the upper wide portion 21 of the shallow trench isolation layer 20 needs approximately 0.4 μm.

Also, the P-type semiconductor region 23 formed around the shallow trench isolation layer 20 can prevent the depletion layer extended from the N-type semiconductor region 23 of the photodiode from reaching the side wall of the shallow trench isolation layer 20 to thereby suppress the occurrence of a dark current generated on the interface (insulating layer/silicon interface) of the side wall of the shallow trench isolation layer 20.

Accordingly, the impurity concentration and width of the P-type semiconductor region 23 are set in such a manner as to allow the depletion layer extended from the N-type semiconductor region 13 to remain within this P-type semiconductor region 23.

Figure 1:
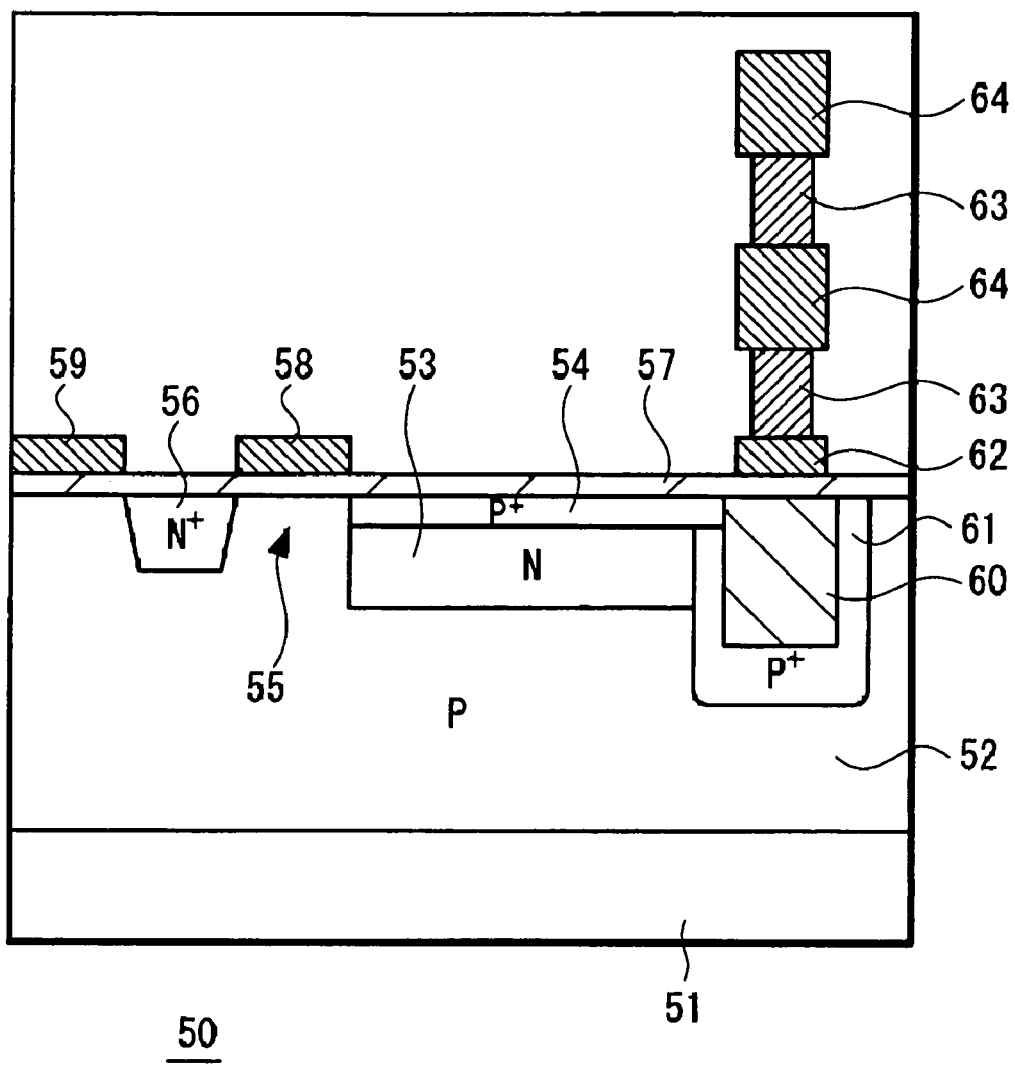
FIG. 1 is a schematic cross-sectional view showing a CMOS (complementary metal-oxide semiconductor) type solid-state image pickup device using a shallow trench isolation layer structure and a buried photodiode structure according to the related art.

Then, as compared with the related-art structure shown in FIG. 1, in the case of this embodiment, since the width of the lower narrow portion 21 of the shallow trench isolation layer 20 is increased, it becomes possible to widen the N-type semiconductor region 13 by increasing the width of the P-type semiconductor region 23. When the N-type semiconductor region 13 is widened as described above, the amount of electric charges accumulated in the light-receiving sensor portion can be increased.

Although the depth of the upper wide portion 21 of the shallow trench isolation layer 20 is not limited from a process standpoint, considering the dark current and the amount of electric charges to be handled, the upper wide portion 21 of the shallow trench isolation layer 20 is formed at the position shallower than the N-type semiconductor region 13 of the buried photodiode of the light-receiving sensor portion.

Also, a positional relationship between the upper wide portion 21 and the lower narrow portion 22 of the shallow trench isolation layer 20 is not determined such that the lower narrow portion 22 need not be located at the center position of the upper wide portion 21 but it is preferable that a distance between the N-type semiconductor region 13 and the lower narrow portion 22 of the shallow trench isolation layer 20 should be increased from the standpoint of the dark current of the P-type semiconductor region 24 surrounding the shallow trench isolation layer 20 and the amount of electric charges to be handled by the light-receiving sensor portion. As shown in FIG. 2, the lower narrow portion 22 is slightly displaced toward the opposite side of the light-receiving sensor portion.

Accordingly, for example, the lower narrow portion 21 may be formed under the end edge of the opposite side of the light-receiving sensor portion of the upper wide portion 21 so that the shallow trench isolation layer 20 may be shaped like L in cross-section.

However, from a standpoint of the burying process for burying the N-type semiconductor region 13 of the buried photodiode into the insulating layer (oxide film, etc.) when the shallow trench isolation layer 20 is formed, it is not preferable that the lower narrow portion 22 should be extended in the lateral direction from the upper wide portion 21 of the shallow trench isolation layer 20.

In order to decrease the read voltage, the N-type semiconductor region 13 of the buried photodiode may be displaced toward the side of the read gate electrode 18 with respect to the positive electric charge accumulation region 14.

Also, since it is desirable that the area of the N-type semiconductor region 13 can be increased as much as possible from the standpoint of increasing the amount of electric charges to be handled, the side of the shallow trench isolation layer 20 of the N-type semiconductor region 13 may be formed so as to adjoin the P-type semiconductor region 23 surrounding the lower narrow portion 22 of the shallow trench isolation layer 20.

Accordingly, in the buried photodiode of the light-receiving sensor portion, the positions of the N-type semiconductor region 13 and the positive electric charge accumulation region 14 need not become identical to those shown in FIG. 2.

According to the arrangement of the solid-state image pickup device 10 of this embodiment, the shallow trench isolation layer 20 formed by filling the insulating layer (oxide film, etc.) into the trench formed on the substrate is composed of the upper wide portion 21 and the lower narrow portion 22. Then, the P-type semiconductor region 23 is formed around the lower narrow portion 22.

More specifically, since the solid-state image pickup device 10 has the arrangement in which the width of the lower narrow portion 22 of the shallow trench isolation layer 20 is made narrow as compared with the related-art single trench isolation layer structure, the P-type semiconductor region 23 that surrounds the lower narrow portion 22 of the shallow trench isolation layer 20 is located at the position deeper than the buried photodiodes 13, 14 of the light-receiving sensor portion.

For this reason, since the area of the N-type semiconductor region 13 of the buried photodiode can be increased as compared with the related-art single shallow trench isolation layer structure, the amount of electric charges to be handled can be increased.

Accordingly, it is possible to construct the solid-state image pickup device 10 having a large dynamic range.

Also, since the shallow trench isolation layer 20 has the arrangement in which the width of the lower narrow portion 22 is made narrow, the lower narrow portion 22 of the shallow trench isolation layer 20 can be covered with the P-type semiconductor region 23 with the sufficient thickness and sufficiently high impurity concentration, whereby the dark current generated from the side wall of the lower narrow portion 22 of the shallow trench isolation layer 20 can be decreased.

In particular, since the depletion layer extended from the N-type semiconductor region 13 of the light-receiving sensor portion to the lateral direction is blocked by this P-type semiconductor region 23, the depletion layer can be prevented from reaching the side wall of the shallow trench isolation layer 20, whereby the occurrence of the dark current and the white spot can be suppressed.

Accordingly, it is possible to realize the solid-state image pickup device 10 which can generate a high-quality image output with a high S/N.

The solid-state image pickup device 10 according to this embodiment can be manufactured as follows, for example.

Other portions than the shallow trench isolation layer portion can be formed by the well-known method and therefore the portions near the shallow trench isolation layer portion will be described below.

Figure 3A:
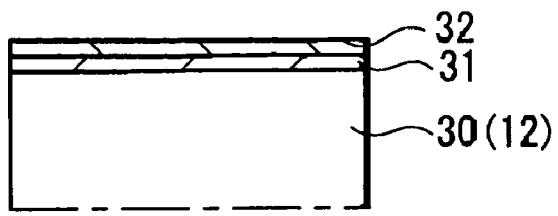
FIGS. 3A to 3M are process diagrams showing the manufacturing processes of the solid-state image pickup device shown in FIG. 2, respectively.

First, as shown in FIG. 3A, an $SiO_2$ film 31 and a silicon nitride film 32 are deposited on the surface (surface of the P-type semiconductor well region 12 shown in FIG. 2) of a substrate made of a silicon wafer, in that order. The silicon nitride film 32 is formed as an etching mask for the silicon wafer of the substrate 30 and it is also formed in order to protect the active region in the process in which the surface is polished by a CMP (chemical mechanical polish) method. The $SiO_2$ film 31 is formed in order to protect the underlayer in the process for releasing the silicon nitride film 32. The film thickness of the $SiO_2$ film 31 is selected to be 10 nm, for example. The film thickness of the silicon nitride film 32 is selected in a range of from 100 to 200 nm, for example.

Figure 3B:
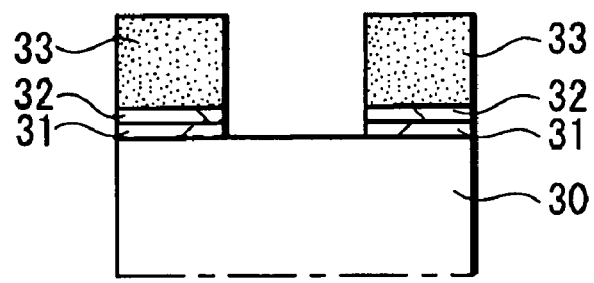

Next, a resist is formed over the surface, and a resist mask 33 for covering other portions than the shallow trench isolation layer portion is formed by exposure and development. Then, as shown in FIG. 3B, the silicon nitride film 32 and the $SiO_2$ film 31 are etched by using this resist mask 33, in that order.

Figure 3C:
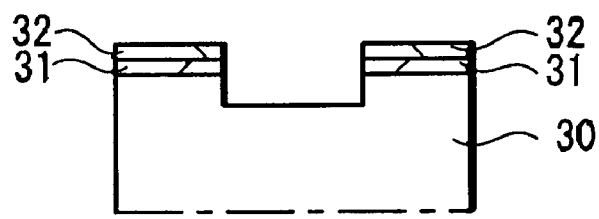

Next, the resist mask 33 is released, and as shown in FIG. 3C, the substrate (silicon substrate) 30 of the region in which the wide portion 21 of the shallow trench isolation layer 20 is formed is etched by using the silicon nitride film 32 as the mask. At that time, the depth of etching is selected to be substantially the same as the thickness of the positive electric charge accumulation region of the buried photodiode, for example, depth of about 100 nm, for example.

Figure 3D:
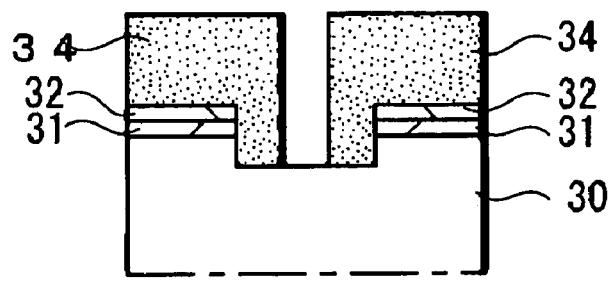

Next, a resist is formed over the surface, and as shown in FIG. 3D, a resist mask 34 for use with the lower narrow portion 22 of the shallow trench isolation layer 20 is formed by exposure and development.

Figure 3E:
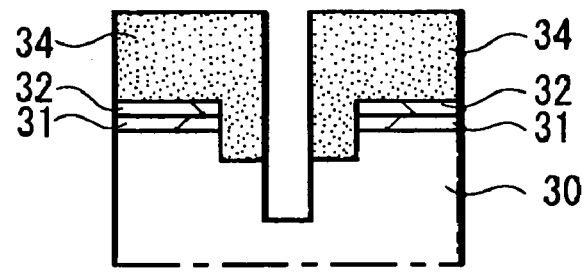

Subsequently, as shown in FIG. 3E, the substrate (silicon substrate) 30 of the region in which the lower narrow portion 22 of the shallow trench isolation layer 20 is formed is etched by using the resist mask 34.

At that time, the depth of etching is selected in a range of from 20 to 30 nm. Thus, a isolation portion (trench) of which cross-section is shaped like T is formed, whereafter the resist mask 34 is removed.

Figure 3F:
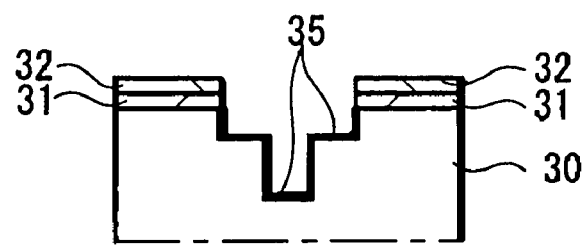

Next, as shown in FIG. 3F, a silicon oxide film 35 having a film thickness of about 10 nm is formed on the side wall and bottom surface of the groove (trench) by thermal oxidation.

Figure 3G:
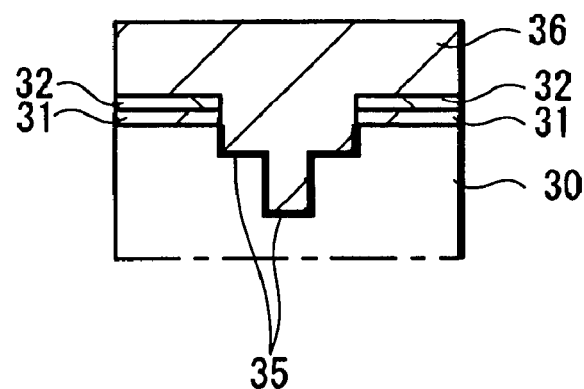

Next, as shown in FIG. 3G, a thick silicon oxide film 36 is deposited on the surface by a high density plasma enhanced CVD (chemical vapor deposition) method.

Figure 3H:
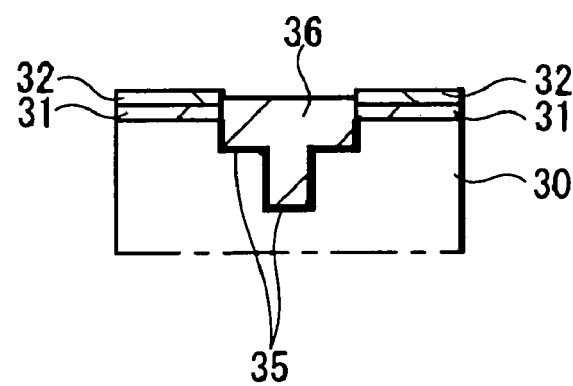

Next, as shown in FIG. 3H, the surface is planarized by the CMP method and the silicon oxide film 36 is removed from the silicon nitride film 32, thereby resulting in the silicon oxide film 36 being left within the groove (trench).

Figure 3I:
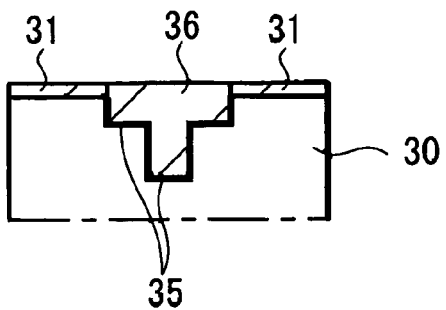

Next, as shown in FIG. 3I, the silicon nitride film 32 is removed by a wet etching process using a suitable material such as heat phosphoric acid.

Figure 3J:
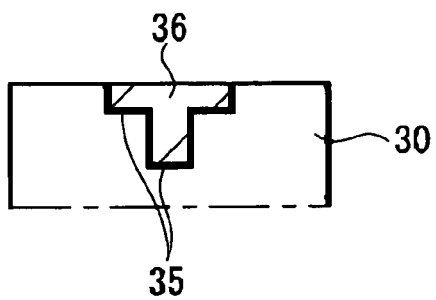

Next, as shown in FIG. 3J, the $SiO_2$ film 31 is removed to expose the silicon of the active region.

Figure 3K:
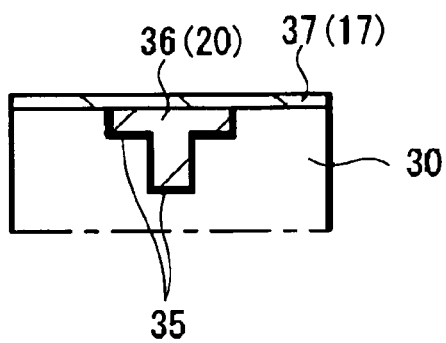

Next, as shown in FIG. 3K, there are formed the gate insulating film 17 and a silicon oxide film 37 which serves as a sacrifice oxide film. For example, the gate insulating film 17 and the silicon oxide film 37 are formed by a thermal oxidation process of the thus exposed silicon 30. The shallow trench isolation layer 20 having the T-like cross-section is formed by the thick silicon oxide film 36.

Figure 3L:
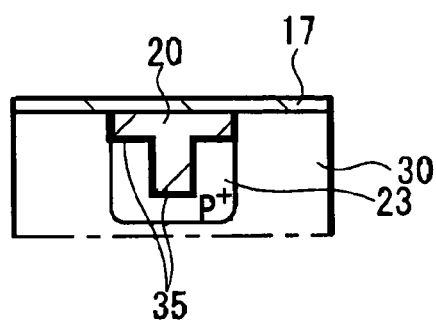

Next, the P-type semiconductor region 23 is formed so as to cover the lower narrow portion 22 of the shallow trench isolation layer 20 by implanting ions of P-type impurities as shown in FIG. 3L.

Figure 3M:
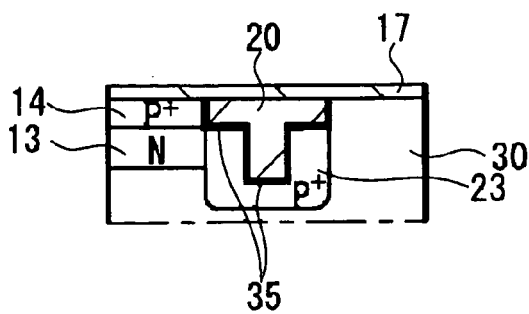

After a gate electrode forming process or the like was executed although not shown, the N-type semiconductor region (electric charge accumulation region) 13 of the buried photodiode and the P-type positive electric charge accumulation region 14 are formed, in that order, by an ion implantation process as shown in FIG. 3M.

While the electric charge accumulation region of the light-receiving sensor portion is the N-type semiconductor region and the P-type positive electric charge accumulation region is formed on the surface of this N-type semiconductor region to thereby form the so-called buried photodiode structure as described above in the embodiment of the present invention, the present invention is not limited thereto and can be applied to a reverse conductivity type solid-state image pickup device.

In the case of the reverse conductivity type solid-state image pickup device, an N-type semiconductor region (negative electric charge accumulation region) is formed on the surface of a P-type electric charge accumulation region and thereby a buried photodiode structure is constructed. Also, an N-type semiconductor region is formed around a shallow trench isolation layer in order to decrease a dark current.

While the present invention is applied to the CMOS type solid-state image pickup device in the above-mentioned embodiment, the present invention is not limited thereto and can be applied to solid-state image pickup devices of other arrangements, for example, a CCD (charge-coupled device) solid-state image pickup device.

When the present invention is applied to the CCD solid-state image pickup device, a shallow trench isolation layer having an arrangement including a shallow wide portion and a deep narrow portion may be formed at the portion that serves a so-called channel stopper region, for example, and a second conductivity type semiconductor region for preventing a dark current may be formed around at least the deep narrow portion of the shallow trench isolation layer.

Figure 4:
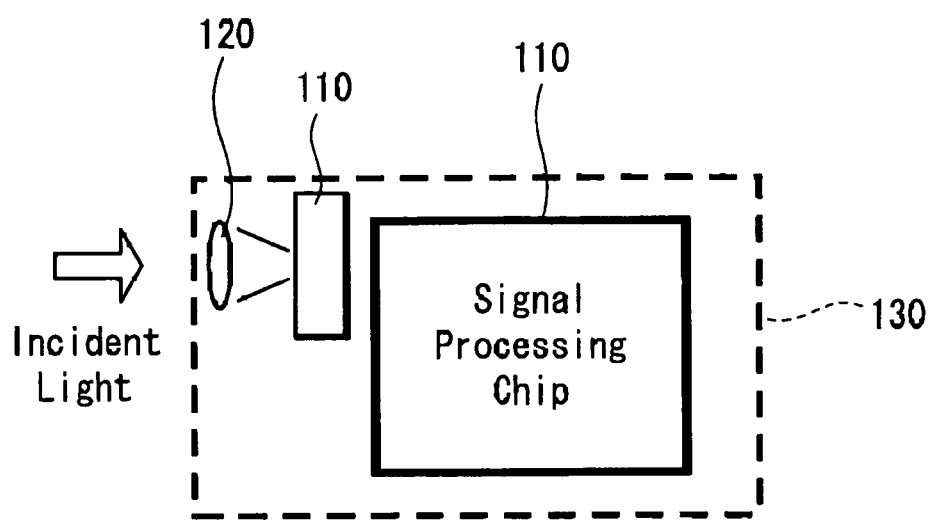
FIG. 4 is a schematic diagram showing an arrangement of a module type solid-state image pickup device according to another embodiment of the present invention.

Furthermore, the solid-state image pickup apparatus (device) according to the present invention may be either a solid-state image pickup apparatus formed as one chip or a module type solid-state image pickup apparatus formed as a set of a plurality of chips. FIG. 4 is a schematic diagram showing an example of a module type solid-state image pickup device. As shown in FIG. 4, when the solid-state image pickup apparatus (device) according to the present invention is the module type solid-state image pickup apparatus formed as a set of a plurality of chips, such module type solid-state image pickup apparatus 130 is comprised of a sensor chip 100 for taking a picture, a digital signal processing chip 110 and further an optical system 120. When the solid-state image pickup apparatus according to the present invention is the module type solid-state image pickup apparatus, this solid-state image pickup apparatus can generate a high-quality output signal with a wide dynamic range and performance of an electronic device with a module mounted thereon can be improved.

According to the present invention, there is provided a solid-state image pickup device which is comprised of a sensor portion including a first conductivity type electric charge accumulation region and a second conductivity type semiconductor region formed above the first conductivity type electric charge accumulation region and a isolation portion provided within a trench formed on a semiconductor substrate, wherein the shallow trench isolation region is composed of an upper wide region and a lower narrow portion, a second conductivity type semiconductor region being formed around the lower narrow portion.

According to the present invention, in the solid-state image pickup device, the upper wide portion includes a first diffusion region, the lower narrow portion includes a second diffusion region different from the first diffusion region and the first and second diffusion regions are overlapping with each other at their respective end portions.

Further, according to the present invention, there is provided a module type solid-state image pickup device which is comprised of an image pickup region comprising a plurality of pixels, each of which includes a sensor portion composed of a first conductivity type electric charge accumulation region and a second conductivity type semiconductor region formed above the first conductivity type electric charge accumulation region and an optical system for introducing incident light into the image pickup region, wherein the pixel includes a isolation portion adjacent to the sensor portion, the isolation portion composed of an upper wide portion and a lower narrow portion and a second conductivity type semiconductor region is formed around the lower narrow portion.

According to the present invention, in the module type solid-state image pickup device, the upper wide portion includes a first diffusion region, the lower narrow portion includes a second diffusion region different from the first diffusion region and the first and second diffusion regions are overlapping with each other at their respective end portions.

As a result, since the shallow trench isolation layer includes the lower narrow portion and it is located behind the light-receiving sensor portion as compared with the related-art single shallow trench isolation layer structure, the area of the first conductivity type electric charge accumulation region of the light-receiving sensor portion can increase to increase an amount of electric charges that can be handled by the light-receiving sensor portion.

Also, a dark current generated from the side wall of the lower portion of the shallow trench isolation layer can be decreased by the second conductivity type semiconductor region formed around the lower narrow portion of the shallow trench isolation layer. In particular, the depletion layer extending from the first conductivity type electric charge accumulation region of the light-receiving sensor portion to the lateral direction is blocked by the second conductivity type semiconductor region, whereby the depletion layer can be prevented from reaching the side wall of the shallow trench isolation layer. As a result, it is possible to suppress the occurrence of a dark current and a white spot.

As described above, according to the present invention, since the area of the electric charge accumulation region of the photodiode of the light-receiving sensor portion can be increased as compared with the related-art single trench isolation layer structure, an amount of signal electric charges that can be accumulated (electric charges to be handled) can be increased. As a result, it is possible to obtain a solid-state image pickup device with a large dynamic range.

Also, according to the present invention, since the occurrence of the dark current and the white spot can be suppressed by the second conductivity type semiconductor region formed around the lower narrow portion of the shallow trench isolation layer without oppressing the characteristic of the amount of the electric charges to be handled, it is possible to realize a solid-state image pickup device having a high S/N (signal-to-noise ratio) and which can generate an image output with high image quality.

Therefore, according to the present invention, it becomes possible to realize a solid-state image pickup device in which the occurrence of a dark current and a white spot can be suppressed, an image with high image quality can be obtained and in which a sufficiently large amount of electric charges that are handled by a light-receiving sensor portion can be maintained.

Furthermore, according to the present invention, when a solid-state image pickup apparatus is a module type solid-state image pickup apparatus, it is possible to obtain a high-quality output signal with a wide dynamic range and performance of an electronic device with a module mounted thereon can be improved.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid-state image pickup device comprising:
    a sensor portion including a first conductivity type electric signal charge accumulation region and a second conductivity type semiconductor region formed above said first conductivity type electric charge accumulation region; and
    an isolation portion provided within a trench extending from a level of the second conductivity charge accumulation region down at least into a level of the first conductivity type semiconductor region, wherein said isolation portion is composed of an upper wide portion and a lower narrow portion and includes a stepped structure, a second conductivity type semiconductor region being formed around said lower narrow portion of said isolation portion;
    wherein the upper wide portion is primarily located in a same level of the device as the second conductivity type region and further wherein the lower narrow portion of the isolation is generally uniform in size.

2. A module type solid-state image pickup device comprising:
    an image pickup region comprising a plurality of pixels, each of which includes a sensor portion composed of a first conductivity type electric signal charge accumulation region and a second conductivity type semiconductor region formed above said first conductivity type electric charge accumulation region; and
    an optical system for introducing incident light into said image pickup region, wherein said pixel includes an isolation portion adjacent to said sensor portion, said isolation portion composed of an upper wide portion and a lower narrow portion, and including a stepped structure and a second conductivity type semiconductor region is formed around said lower narrow portion of said isolation portion;
    wherein the upper wide portion is primarily located in a same level of the device as the second conductivity type region and further wherein the lower narrow portion of the isolation is generally uniform in size.

3. The solid-state image pickup device of claim 1, wherein the lower narrow portion of the isolation portion; centrally located beneath the upper wide portion.

4. The solid-state image pickup device of claim 2, wherein the lower narrow portion of the isolation portion is centrally located beneath the upper wide portion.

5. The solid-state image pickup device of claim 1, wherein the lower narrow portion of the isolation portion extends beneath the first conductivity type electric signal charge accumulation region.

6. The solid-state image pickup device of claim 2, wherein the lower narrow portion of the isolation portion extends beneath the first conductivity type electric signal charge accumulation region.

* * * * *